United States Patent
Jain et al.

(10) Patent No.: US 9,325,312 B1
(45) Date of Patent: Apr. 26, 2016

(54) INPUT CONTROL CIRCUIT FOR ANALOG DEVICE

(71) Applicants: Mayank Jain, Ambala Cantt (IN); Sanjoy K. Dey, Noida (IN)

(72) Inventors: Mayank Jain, Ambala Cantt (IN); Sanjoy K. Dey, Noida (IN)

(73) Assignee: FREESCALE SEMICONDUCTOR, INC., Austin, TX (US)

( * ) Notice: Subject to any disclaimer, the term of this patent is extended or adjusted under 35 U.S.C. 154(b) by 0 days.

(21) Appl. No.: 14/568,093

(22) Filed: Dec. 11, 2014

(51) Int. Cl.
*H03K 17/687* (2006.01)

(52) U.S. Cl.
CPC .................................. *H03K 17/687* (2013.01)

(58) Field of Classification Search
CPC .................................................. H03K 17/687
USPC ......... 327/365, 419, 427, 434, 436, 437, 574, 327/576, 581
See application file for complete search history.

(56) References Cited

U.S. PATENT DOCUMENTS

| | | | |
|---|---|---|---|
| 6,483,386 B1 | 11/2002 | Cress et al. | |
| 7,940,091 B1 * | 5/2011 | Govindarajulu | G11C 27/02 327/390 |
| 8,259,424 B1 | 9/2012 | Lin | |
| 2009/0039924 A1 * | 2/2009 | Zanchi | G11C 27/024 327/94 |

* cited by examiner

*Primary Examiner* — William Hernandez
(74) *Attorney, Agent, or Firm* — Charles E. Bergere

(57) ABSTRACT

An input control circuit that can be used to drive analog switches of analog modules such as an analog-to-digital converter (ADC) enables a sampling switch to receive a higher input voltage than the voltage rating of the devices comprising the sampling switch without risk of damage and without the need for a resistor divider network. The input control circuit and switch both receive an input voltage to be processed and the input control circuit generates a control signal for the switch that is derived from a pre-charged capacitor. The control circuit permits the design and manufacture of high voltage analog modules using low voltage devices, which can save on mask costs without any performance tradeoffs.

4 Claims, 1 Drawing Sheet

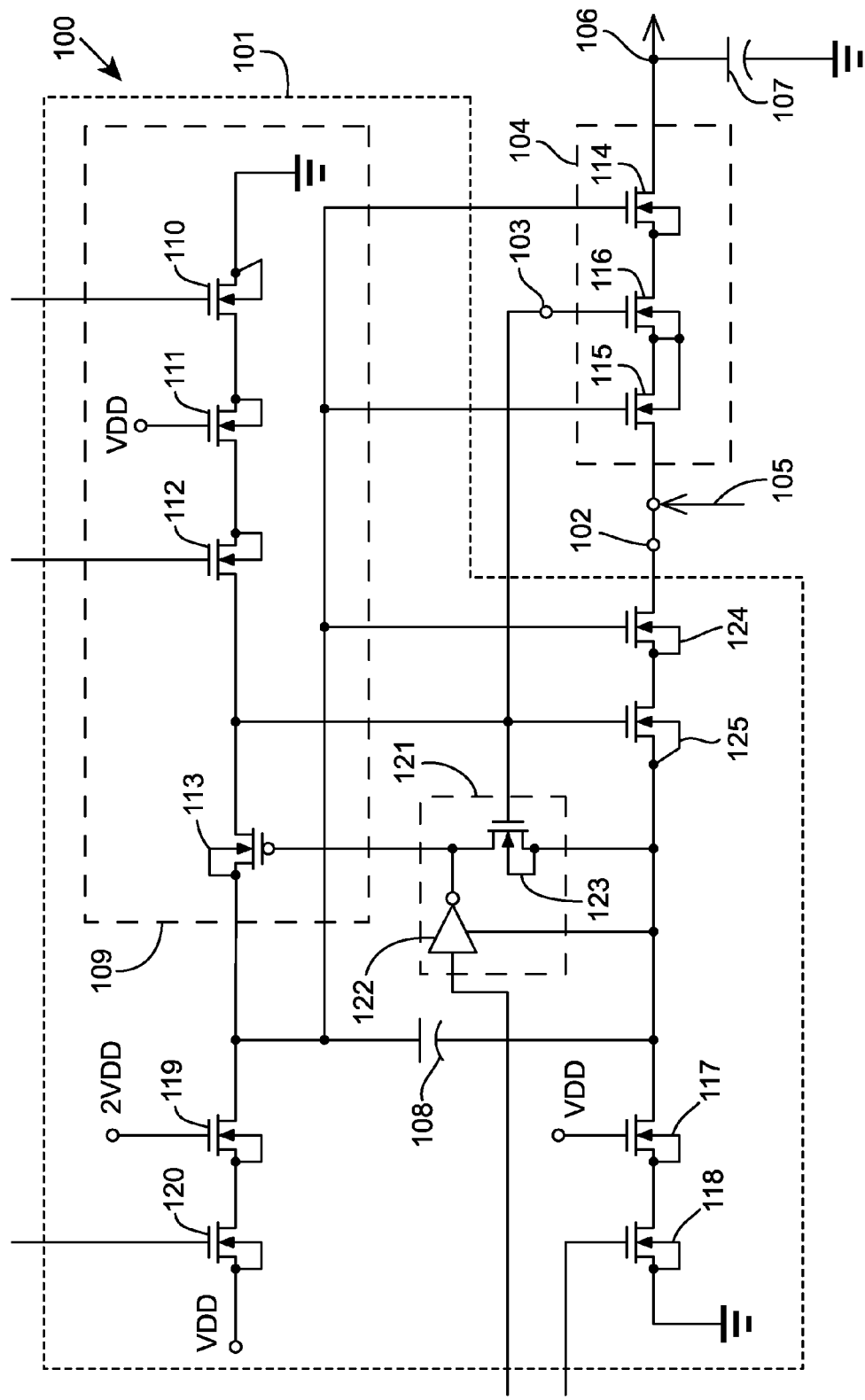

INPUT CONTROL CIRCUIT FOR ANALOG DEVICE

BACKGROUND OF THE INVENTION

The present invention relates generally to integrated circuits and, more particularly, to an integrated circuit for enabling lower voltage-rated devices to handle higher input voltages.

Analog functional modules (for example, an analog-to-digital converter (ADC) of a system on chip (SOC) device sometimes need to handle input voltages that exceed the voltage rating of the devices constituting the analog functional module. One known way of handling high analog input voltage ranges employs a resistor divider network connected at the front end of the analog module. However, the resistor divider network constitutes a continuous load on the input. Disconnecting the resistor divider network when the module is idle reduces the load but still leaves the component devices at risk of damage if a high voltage should appear on the input. A further disadvantage associated with use of a resistor divider network, particularly in the case of an ADC, is that the input voltage swing is reduced (typically by 50%) along with a potential signal to noise reduction of 6 db. Also, disadvantageously, a trade-off between speed and input loading (and gain error) has to be made by the designer.

Thus, it would be advantageous to provide a circuit for an analog device that enabled the analog device to handle higher voltages than the voltage ratings of its constituent devices without the need for a resistor divider network.

BRIEF DESCRIPTION OF THE DRAWINGS

The invention, together with objects and advantages thereof, may best be understood by reference to the following description of preferred embodiments together with the accompanying drawings in which:

FIG. 1 is a schematic circuit diagram of a front-end circuit suitable for an analog module or device and which includes an input circuit in accordance with an embodiment of the invention.

DETAILED DESCRIPTION OF PREFERRED EMBODIMENTS

The detailed description set forth below in connection with the appended drawings is intended as a description of presently preferred embodiments of the invention, and is not intended to represent the only forms in which the present invention may be practised. It is to be understood that the same or equivalent functions may be accomplished by different embodiments that are intended to be encompassed within the spirit and scope of the invention. In the drawings, like numerals are used to indicate like elements throughout. Furthermore, terms "comprises," "comprising," or any other variation thereof, are intended to cover a non-exclusive inclusion, such that module, circuit, device components, structures and method steps that comprises a list of elements or steps does not include only those elements but may include other elements or steps not expressly listed or inherent to such module, circuit, device components or steps. An element or step proceeded by "comprises . . . a" does not, without more constraints, preclude the existence of additional identical elements or steps that comprises the element or step.

In one embodiment, the present invention provides a control circuit for an analog device that includes a sampling switch arrangement having a control input and arranged to receive an analog voltage to be sampled. The control circuit comprises an input terminal for receiving the analog voltage to be sampled, an output terminal for connection to the control input of the sampling switch arrangement, a first switch arrangement, a charging capacitor operably coupled between the input terminal and the first switch arrangement and to the output terminal, and a charging circuit operably coupled to the capacitor for charging the capacitor to a preset voltage. The first switch arrangement connects the output terminal to ground in an 'off' mode of operation and transfers a voltage from a terminal of the charging capacitor to the output terminal in an 'on' mode of operation.

In another embodiment, the invention provides an analog device comprising a control circuit and a sampling switch. The control circuit comprises an input terminal for receiving an analog voltage to be sampled, an output terminal, a first switch arrangement, a charging capacitor operably coupled between the input terminal and the first switch arrangement, and a charging circuit operably coupled to the capacitor for charging the capacitor to a preset voltage. The first switch arrangement connects the output terminal to ground in an 'off' mode of operation and transfers a voltage from a terminal of the charging capacitor to the output terminal in an 'on' mode of operation. The sampling switch comprises a first NMOSFET (metal oxide semiconductor field effect transistor) connected in series between second and third NMOSFETs where a drain terminal of the second NMOSFET receives the analog voltage to be sampled, a drain terminal of the third NMOSFET comprises an output of the sampling circuit, gate terminals of the second and third NMOSFETs are connected to the capacitor, and a gate terminal of the first NMOSFET is connected to the output terminal of the control circuit.

In one example, the input circuit can be used with an analog module (such as an ADC) to process 3.3 volt input signals using devices rated at 1.8 volts with reliability and precision.

Referring now to FIG. 1, an electrical circuit 100 suitable for use as a front-end circuit for an ADC is shown. A control circuit 101 has an input terminal 102 and a control output 103. A sampling switching circuit 104 receives, on line 105, an input analog voltage to be sampled. In an 'on' mode of operation the sampling switching circuit 104 transfers the received input voltage to an output terminal 106 that is connected to a sampling capacitor 107. In an 'off' mode of operation no input voltage is transferred as the sampling switching circuit 104 is turned off in this mode. The output 106 of the sampling switching circuit 104 is connected to ADC circuitry (not shown) and can go higher than device ratings in situations such as ADC sampling of other inputs. The input terminal 102 of the control circuit 101 also receives the input voltage on line 105. In one embodiment, the circuit 100 is implemented in a SOC device, which typically includes a plurality of other functional modules.

The control circuit 101 includes a charging capacitor 108. The control circuit 101 also includes a first switch arrangement 109 that comprises first, second, and third N channel metal oxide semiconductor field effect transistors (NMOSFETs) 110, 111, 112 respectively and a P-channel MOSFET (PMOSFET) 113. The first switch arrangement 109 connects the control output 103 to ground in an 'off' mode of operation and transfers a voltage from a terminal of the charging capacitor 108 to the control output 103 in an 'on' mode of operation.

Referring now to the sampling switching circuit 104, in this embodiment, the sampling switching circuit 104 comprises three NMOSFETs connected in series. A fourth NMOSFET 114 and a fifth NMOSFET 115 have gate terminals connected to a first terminal of the charging capacitor 108 of the control circuit 101. A sixth NMOSFET 116 connected in series between the fourth and fifth NMOSFETs 114, 115, has a gate terminal connected to the control output 103 of the control circuit 101. In the 'off' mode the control output 103 and therefore the gate terminal of the sixth NMOSFET is grounded and in the 'on' mode this gate terminal is connected to a first terminal of the charging capacitor 108.

The control circuit 101 also includes seventh, eighth, ninth, and tenth NMOSFETs 117, 118, 119 and 120, respectively, which facilitate charging of the charging capacitor 108 in a manner to be described below. The control circuit 101 also includes a second switch arrangement 121 comprising a tri-state inverter 122 and an eleventh NMOSFET 123. The second switch arrangement 121 ensures over-voltage protection of the PMOSFET 113. The control circuit 101 also includes twelfth and thirteenth NMOSFETs 124, 125 that are connected in series between the input terminal 102 and a second terminal of the charging capacitor 108.

The electrical circuit 100 will now be described in greater detail. The sampling switching circuit 104 accurately passes a voltage appearing on the input line 105 to the output 106 and as mentioned above comprises three NMOSFETs 114, 115, 116 connected in series. The fourth NMOSFET 114 has a drain terminal connected to a first terminal of the sampling capacitor 107 whose second terminal is connected to ground, and a source terminal connected to a drain terminal of the sixth NMOSFET 116. A source terminal of the sixth NMOSFET 116 is connected to a source terminal of the fifth NMOSFET 115. A drain terminal of the fifth NMOSFET is connected to the input line 105. A gate-to-source voltage for each of the NMOSFETs 114, 115, 116 that comprise the sampling switching circuit 104 is provided by the charging capacitor 108, once charged.

A drain terminal of the twelfth NMOSFET 124 is connected to the input line 105. A gate terminal of the twelfth NMOSFET 124 is connected to the first terminal of the charging capacitor 108. A source terminal of the twelfth NMOSFET 124 is connected to a drain terminal of the thirteenth NMOSFET 125 whose gate terminal is connected to the control output 103. A source terminal of the thirteenth NMOSFET 125 is connected to the second terminal of the charging capacitor. The twelfth and thirteenth NMOSFETs 124, 125 are used to connect the input voltage to the second terminal of the charging capacitor 108 in order to create a sufficient gate-to-source voltage at each of the NMOSFETs 114, 115, 116 comprising the sampling switching circuit 104 in the 'on' mode.

Circuitry for controlling the charging of the charging capacitor 108 will now be described. A drain terminal of the seventh NMOSFET 117 is connected to the second terminal of the charging capacitor 108. A gate terminal of the seventh NMOSFET 117 is connected to a supply voltage supply VDD and a source terminal of the seventh NMOSFET 117 is connected to a drain terminal of the eighth NMOSFET 118. A source terminal of the eighth NMOSFET 118 is connected to ground and its gate terminal receives a first mode select signal that is generated elsewhere on the SOC. The first mode select signal is either zero volts or VDD. When the eighth NMOSFET 118 is turned on, the second terminal of the charging capacitor 108 is grounded. A drain terminal of the ninth N MOSFET 119 is connected to the first terminal of the charging capacitor 108. A gate terminal of the ninth NMOSFET 119 is connected to a voltage supply, which in this example is twice VDD. A source terminal of the ninth NMOSFET 119 is connected to a drain terminal of the tenth NMOSFET 120 whose source terminal is connected to the voltage supply VDD. A gate terminal of the tenth NMOSFET 120 is connected to a second mode select signal, which is generated elsewhere on the SOC. The second mode select signal is either VDD or twice VDD. When the tenth NMOSFET 120 is turned on, the first terminal of the charging capacitor 108 is connected to the voltage supply VDD. Thus, the seventh, eighth, ninth and tenth NMOSFETs 117, 118, 119, 120 are used to pre-charge the charging capacitor 108 to a voltage level of VDD.

In the first switch arrangement 109, a source terminal of the first NMOSFET 110 is connected to ground and a drain terminal of the first NMOSFET 110 is connected to a source terminal of the second NMOSFET 111. A gate terminal of the first NMOSFET 110 is connected to a third mode select signal, which is generated elsewhere on the SOC. The third mode select signal is either zero volts or VDD. A gate terminal of the second NMOSFET 111 is connected to VDD and a drain terminal of the second NMOSFET 111 is connected to a source terminal of the third NMOSFET 112. A gate terminal of the third NMOSFET 112 is connected to a fourth mode select signal, which is generated elsewhere on the SOC. The fourth mode select signal is either VDD or twice VDD. A drain terminal of the third NMOSFET 112 is connected to the control output 103 and to a drain terminal of the PMOSFET 113. A source terminal of the PMOSFET 113 is connected to the first terminal of the charging capacitor 108. A gate terminal of the PMOSFET 113 is connected to the second switch arrangement 121. When the first and third NMOSFETs 110, 112 are turned on, the control output 103 is grounded and consequently the sampling switching circuit 104 is off. When the PMOSFET 113 is on, it permits the voltage stored on the first terminal of the charging capacitor 108 to be transferred to the control output 103 (and therefore turns on the sampling switching circuit 104).

The 11th NMOSFET 123 of the second switch arrangement 121 has a drain terminal connected to the gate terminal of the PMOSFET 113 and to a first output of the inverter 122. A gate terminal of the eleventh NMOSFET 123 is connected to the control output 103. A second output of the inverter 122 is connected to the second terminal of the charging capacitor 108 and an input of the inverter 122 is connected to a fifth mode select signal, which is generated elsewhere on the SOC. The fifth mode select signal is either zero volts or VDD. The eleventh NMOSFET 123 is used to protect the PMOSFET 113 against an overvoltage appearing on the first terminal of the charging capacitor 108.

In operation, the control circuit 101 permits the sampling switching circuit 104 to transfer an input voltage on line 105 to its output 106 and sampling capacitor 107, which can be up to a level of twice the rating of the NMOSFETs 114, 115, 116 comprising the sampling switching circuit without risk of damage to these NMOSFETs. Further, the MOSFETs comprising the control circuit 101 are also protected from any over-voltage condition. In this example, the input voltage to be sampled can have any level between 0 volts and twice VDD while voltages across terminals of the MOSFETs are limited to VDD.

In order to protect the sixth NMOSFET 116 (which is the main switching element used to transfer the input voltage to the sampling capacitor 107), it has to be ensured that voltage differences across its terminals never rise above the rated level while at the same time there should be a sufficient gate-to-source voltage present in order to reduce ON resistance to a level that permits transfer of the input voltage with the required precision. In a particular application of analog multiplexing, a sampling switching circuit typically comprises several transistors connected in parallel and in such an application, both input and output voltages can vary from 0 to twice VDD. To ensure that the sixth NMOSFET 116 is held off in the 'off' mode, its gate voltage has to be reliably held at zero volts. However, this can pose a reliability risk for the sixth NMOSFET 116 because its source and/or drain terminals could rise to a level as high as twice VDD. However, the presence of the fourth and fifth NMOSFETs connected in series either side of the sixth NMOSFET 116 prevent this situation from occurring.

The control circuit 101 ensures that when operating in the 'on' mode, all three NMOSFETs 114, 115, 116 comprising the sampling switching circuit 104 have a gate voltage that is higher than the input voltage (this is ensured of the action of the charging capacitor 108). Further, when operating in the 'off' mode, the gate terminal of the sixth NMOSFET 116 is grounded and the gate terminals of the fourth and fifth NMOSFETs 114, 115 are held at VDD (this is ensured by the action of the components of the first switch arrangement 109). Thus, the components of the sampling switching circuit 104 devices are protected while still reliably keeping the sampling switching circuit 104 off.

To generate gate-to-source voltages for the NMOSFETs of the sampling switching circuit 104 in the 'on' mode, the charging capacitor 108 is used. During the 'off' mode, charging is enabled by setting the first and second mode select signals so that the second terminal of the charging capacitor 108 is grounded via the seventh and eighth NMOSFETs 117, 118 and the first terminal of the charging capacitor 108 is connected to the voltage supply VDD via the ninth and tenth NMOSFETs 119, 120. Once the charging capacitor 108 has been charged to a desired voltage (Vc), the first and second mode select signals are reset so that the charging capacitor is isolated from ground and VDD. At this stage, the second terminal of the charging capacitor 108 is now connected to the input 105 through the twelfth and thirteenth NMOSFETs 124, 125. It will be noted that the second terminal of the charging capacitor can be as high as twice VDD. Now the voltage level on the first terminal of the charging capacitor is Vc plus the level of the input voltage on line 105. It will be noted that this voltage could be as high as 3VDD if the charging capacitor has been charged to VDD and the input level is at twice VDD. The ninth and tenth NMOSFETs 119, 120 are protected from a voltage as high as 3VDD because their gates are set at 2VDD in this charging phase.

Now that the charging capacitor 108 has been charged, an 'on' mode of operation can follow. The third, fourth and fifth mode select signals are set so that the resulting action of the first switch arrangement 108 permits the voltage on the first terminal of the charging capacitor 108 to be transferred to the gate terminals of the NMOSFETs of the sampling switching circuit 104, thereby turning it on, and the eleventh NMOSFET 123 also to turn on.

The gate terminals of the fourth and fifth NMOSFETs 114, 115 need to be at a level equal to the input voltage level plus VDD in the 'on' mode while they must be connected to VDD in the 'off' mode. This is achieved by directly connecting these gate terminals to the first terminal of the charging capacitor 108. The gate terminal of the sixth N MOSFET 116, however, needs to vary from zero volts in the 'off' mode to a voltage level equal to the input voltage level plus VDD in the 'on' mode (to ensure that its gate-to-source voltage will never rise beyond the voltage rating for this NMOSFET of VDD). To achieve this, the gate terminal of the sixth NMOSFET 116 is coupled to the first terminal of the charging capacitor 108 through the PMOSFET 113. In the 'on' mode, the PMOSFET 113 shorts the gate terminal of the sixth transistor 116 to the first terminal of the charging capacitor 108, whereas in the 'off' mode this gate terminal is connected to ground through the first, second and third NMOSFETs 110, 111, 112. The gate terminal voltages of the first, second and third NMOSFETs 110, 111, 112 are chosen so that they can tolerate voltages as high as three times VDD (which could occur during an 'off' condition).

The gate terminal of the PMOSFET 113 needs to be shorted to the second terminal of the charging capacitor 108 in the 'on' mode while it should be at VDD in the 'off' mode. These conditions are fulfilled by the action of the inverter 122 and the eleventh NMOSFET 123. Connecting the gate terminal of the PMOSFET 113 to the second terminal of the charging capacitor 108 ensures that the PMOSFET 113 does not turn off before the charging capacitor has discharged and the voltage on the gate terminal of the sixth NMOSFET 116 has risen to the required level.

Advantageously, the present invention provides an input control circuit that can be used to drive analog switch arrangements of analog devices or modules such as an ADC or multiplexer, for example and that can enable the switch arrangement to receive a higher input voltage than the voltage rating of the switch arrangement without risk of damage and without the need for a resistor divider network. Obviating the requirement for a resistor divider network eliminates its associated short-comings of excessive loading, speed reduction and the need for customer-end trimming. Furthermore, the invention also ensures that the components of the input circuit are also protected from any over-voltage conditions. As the invention permits the design and manufacture of high voltage analog modules using low voltage devices, this has the advantage of saving on mask costs.

It will be appreciated that while the example of FIG. 1 has been described in the context of an ADC processing an input voltage, the control circuit 101 may be used with other analog functional modules and devices.

The connections as discussed herein may be any type of connection suitable to transfer signals from or to the respective nodes, units or devices, for example via intermediate devices. Accordingly, unless implied or stated otherwise, the connections may for example be direct connections or indirect connections. The connections may be illustrated or described in reference to being a single connection, a plurality of connections, unidirectional connections, or bidirectional connections. However, different embodiments may vary the implementation of the connections. For example, separate unidirectional connections may be used rather than bidirectional connections and vice-versa. Also, plurality of connections may be replaced with a single connection that transfers multiple signals serially or in a time multiplexed manner. Likewise, single connections carrying multiple signals may be separated out into various different connections carrying subsets of these signals. Therefore, many options exist for transferring signals.

Although specific conductivity types or polarity of potentials have been described in the examples, it will be appreciated that conductivity types and polarities of potentials may be reversed.

The description of the preferred embodiments of the present invention has been presented for purposes of illustration and description, but is not intended to be exhaustive or to limit the invention to the forms disclosed. It will be appreciated by those skilled in the art that changes could be made to the embodiments described above without departing from the broad inventive concept thereof. It is understood, therefore, that this invention is not limited to the particular embodiment disclosed, but covers modifications within the spirit and scope of the present invention as defined by the appended claims.

The invention claimed is:

1. A control circuit for an analog device that includes a sampling switch arrangement that receives an analog voltage to be sampled and has a control input, the control circuit comprising:
   an input terminal for receiving the analog voltage to be sampled;
   an output terminal for connection to the control input of the sampling switch arrangement;
   a first switch arrangement;
   a charging capacitor operably coupled between the input terminal and the first switch arrangement; and
   a charging circuit operably coupled to the charging capacitor for charging the charging capacitor to a preset voltage,
   wherein the first switch arrangement connects the output terminal to ground in an 'off' mode of operation and transfers a voltage from a terminal of the charging capacitor to the output terminal in an 'on' mode of operation.

2. The control circuit of claim 1 wherein the first switch arrangement comprises:
   a P MOSFET (P channel metal oxide semiconductor field effect transistor) connected in series with an N MOSFET (N channel MOSFET), for connecting the output terminal to ground by way of the N MOSFET in the 'off' mode and transferring a voltage from a terminal of the charging capacitor to the output terminal by way of the P MOSFET in the 'on' mode.

3. The control circuit of claim 2, wherein the charging circuit sets a first terminal of the charging capacitor to a voltage equal to the received analog voltage plus a charging voltage, and sets a second terminal of the charging capacitor to the received analog voltage, and
   wherein a source terminal of the P MOSFET is connected to the first terminal of the charging capacitor, and
   wherein the control circuit includes a second switch arrangement that connects a gate terminal of the P MOSFET to a supply voltage in the 'off' mode and to the second terminal of the charging capacitor in the 'on' mode.

4. An analog device comprising a control circuit and a sampling switch, the control circuit comprising:
   an input terminal for receiving an analog voltage to be sampled;
   an output terminal;
   a first switch;
   a charging capacitor operably coupled between the input terminal and the first switch; and
   a charging circuit operably coupled to the charging capacitor for charging the charging capacitor to a preset voltage,
   wherein the first switch connects the output terminal to ground in an 'off' mode of operation and transfers a voltage from a terminal of the charging capacitor to the output terminal in an 'on' mode of operation, and
   wherein the sampling switch comprises:
      a first N MOSFET (metal oxide semiconductor field effect transistor) connected in series between second and third N MOSFETs,
      wherein a drain terminal of the second N MOSFET receives the analog voltage to be sampled, a drain terminal of the third N MOSFET comprises an output of the sampling switch, gate terminals of the second and third N MOSFETs are connected to the charging capacitor, and a gate terminal of the first N MOSFET is connected to the output terminal of the control circuit.

* * * * *